(12) United States Patent
Ko et al.

(10) Patent No.: US 11,186,908 B2
(45) Date of Patent: Nov. 30, 2021

(54) APPARATUS AND METHOD OF MANUFACTURING DISPLAY APPARATUS

(71) Applicant: Samsung Display Co., Ltd., Yongin-si (KR)

(72) Inventors: Seokjin Ko, Yongin-si (KR);
Myungsoo Huh, Yongin-si (KR);
Sukwon Jung, Yongin-si (KR);
Dongkyun Ko, Yongin-si (KR); Inkyo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 81 days.

(21) Appl. No.: 16/160,757

(22) Filed: Oct. 15, 2018

(65) Prior Publication Data

US 2019/0211445 A1     Jul. 11, 2019

(30) Foreign Application Priority Data

Jan. 5, 2018  (KR) .................. 10-2018-0001682

(51) Int. Cl.
*C23C 16/44*     (2006.01)
*C23C 16/46*     (2006.01)
*H01L 21/00*     (2006.01)
*H01J 37/32*     (2006.01)
*C23C 16/455*    (2006.01)

(52) U.S. Cl.
CPC .... *C23C 16/4405* (2013.01); *C23C 16/45565* (2013.01); *C23C 16/46* (2013.01); *H01J 37/3244* (2013.01); *H01L 21/00* (2013.01)

(58) Field of Classification Search
CPC .................. C23C 16/45565; C23C 16/4405
See application file for complete search history.

(56) References Cited

U.S. PATENT DOCUMENTS

| | | | |
|---|---|---|---|
| 4,892,753 | A | 1/1990 | Wang et al. |
| 5,000,113 | A | 3/1991 | Wang et al. |
| RE36,623 | E | 3/2000 | Wang et al. |
| 6,167,834 | B1 | 1/2001 | Wang et al. |

(Continued)

FOREIGN PATENT DOCUMENTS

| | | |
|---|---|---|
| KR | 10-2003-0031647 A | 4/2003 |
| KR | 10-2008-0060241 A | 7/2008 |

(Continued)

*Primary Examiner* — Joseph A Miller, Jr.
(74) *Attorney, Agent, or Firm* — Lewis Roca Rothgerber Christie LLP

(57) ABSTRACT

An apparatus for manufacturing a display apparatus includes: a chamber; a head unit configured to supply a process gas and a cleaning gas to an inside of the chamber; which has a storage space where the process gas or the cleaning gas is temporarily stored, and including a nozzle connected to the storage space and configured to guide the process gas or the cleaning gas from the storage space to the inside of the chamber; a susceptor unit arranged to face the head unit and on which a substrate is placeable; a cleaning gas supply unit connected to the head unit and configured to plasmarize the cleaning gas and supply the cleaning gas that is plasmarized to the head unit; and a cleaning gas ejection unit connected to the cleaning gas supply unit and configured to supply the cleaning gas to at least two portions of the storage space.

15 Claims, 5 Drawing Sheets

(56) References Cited

U.S. PATENT DOCUMENTS

| | | | |
|---|---|---|---|
| 8,398,769 B2 | 3/2013 | Park et al. | |
| 2001/0003014 A1* | 6/2001 | Yuda | C23C 16/452 427/562 |
| 2002/0020429 A1* | 2/2002 | Selbrede | H01J 37/32357 134/1.1 |
| 2002/0106459 A1* | 8/2002 | Blain | C23C 16/4405 427/569 |
| 2003/0000546 A1* | 1/2003 | Richardson | B08B 3/06 134/1.1 |
| 2004/0200413 A1* | 10/2004 | Lee | C23C 16/45565 118/715 |
| 2005/0257747 A1* | 11/2005 | Wakabayashi | C23C 16/4581 118/728 |
| 2006/0090700 A1* | 5/2006 | Satoh | C23F 4/00 118/715 |
| 2007/0087579 A1* | 4/2007 | Kitayama | H01J 37/32522 438/778 |
| 2008/0035169 A1 | 2/2008 | Farmakis et al. | |
| 2008/0044589 A1* | 2/2008 | Ichikawa | C23C 16/0245 427/532 |
| 2009/0142513 A1* | 6/2009 | Murakami | C23C 16/4405 427/576 |
| 2012/0180810 A1 | 7/2012 | Beckmann et al. | |

FOREIGN PATENT DOCUMENTS

| | | |
|---|---|---|
| KR | 10-2010-0130748 A | 12/2010 |
| KR | 10-2012-0054023 A | 5/2012 |
| KR | 10-2015-0035058 A | 4/2015 |

* cited by examiner

APPARATUS AND METHOD OF MANUFACTURING DISPLAY APPARATUS

CROSS-REFERENCE TO RELATED APPLICATION

This application claims priority to and the benefit of Korean Patent Application No. 10-2018-0001682, filed on Jan. 5, 2018 in the Korean Intellectual Property Office, the entire disclosure of which is incorporated herein by reference.

BACKGROUND

1. Field

Aspects of embodiments relate to an apparatus and method of manufacturing a display apparatus.

2. Description of the Related Art

Portable electronic apparatuses have been widely used. A portable electronic apparatus may include a compact electronic apparatus, such as a mobile phone. Recently, tablet PCs are being widely used.

To support various functions, a portable electronic apparatus includes a display apparatus for providing a user with visual information, such as still images or videos. Recently, as various parts for operating a display apparatus are miniaturized, a portion taken by the display apparatus in the electronic apparatus is gradually increasing. Also, a structure to enable the display apparatus in a flat state to be bent has been developed.

In general, when a display apparatus is manufactured, during a deposition process, a process gas may be adsorbed inside an apparatus for manufacturing a display apparatus. In this case, a cleaning process is performed to remove the process gas adsorbed inside the display apparatus manufacturing apparatus. However, the cleaning process may not be uniformly performed inside the entire display apparatus manufacturing apparatus.

SUMMARY

According to an aspect of embodiments, an apparatus and method of manufacturing a display apparatus which may uniformly perform a cleaning process are provided.

Additional aspects will be set forth, in part, in the description which follows and, in part, will be apparent from the description, or may be learned by practice of the presented embodiments.

According to one or more embodiments, an apparatus for manufacturing a display apparatus includes: a chamber; a head unit configured to supply a process gas and a cleaning gas to an inside of the chamber, which has a storage space where the process gas or the cleaning gas is temporarily stored, and comprising a nozzle connected to the storage space and configured to guide the process gas or the cleaning gas from the storage space to the inside of the chamber; a susceptor unit arranged to face the head unit and on which a substrate is placeable; a cleaning gas supply unit connected to the head unit and configured to plasmarize the cleaning gas and supply the cleaning gas that is plasmarized to the head unit; and a cleaning gas ejection unit connected to the cleaning gas supply unit and configured to supply the cleaning gas to at least two portions of the storage space.

The cleaning gas ejection unit may include a first cleaning gas ejection unit connected to the cleaning gas supply unit and configured to supply the cleaning gas to a center portion of the head unit, and a second cleaning gas ejection unit connected to the cleaning gas supply unit and configured to supply the cleaning gas to a portion of the head unit deviated from the center portion thereof.

The first cleaning gas ejection unit may include an orifice unit through which the cleaning gas passes.

A diameter of a portion of the orifice unit having a minimum area in which the cleaning gas passes may be less than a diameter of the second cleaning gas ejection unit.

The second cleaning gas ejection unit may include a plurality of second cleaning gas ejection units, and at least two of the plurality of second cleaning gas ejection units may be arranged symmetrically with respect to the first cleaning gas ejection unit.

The cleaning gas ejection unit may include a diffuser plate that is arranged in an ejection hole through which the cleaning gas is ejected toward the storage space.

The diffuser plate may guide the cleaning gas to a side surface of the ejection hole of the cleaning gas ejection unit.

The cleaning gas ejection unit may include a cleaning gas guide path guiding the cleaning gas supplied by the cleaning gas supply unit; and an ejection hole connected to the cleaning gas guide path, through which the cleaning gas is ejected toward the storage space.

The cleaning gas guide path and the ejection hole may guide the cleaning gas in directions different from each other.

An inner surface of the ejection hole corresponding to a portion of the cleaning gas guide path where the cleaning gas guide path and the ejection hole are connected to each other may be a curved surface.

The apparatus for manufacturing a display apparatus may further include a sensor unit that is arranged in the chamber and configured to detect reaction of the cleaning gas in the chamber during injection of the cleaning gas.

An operation of the cleaning gas supply unit may be controlled based on a value measured by the sensor unit.

According to one or more embodiments, a method of manufacturing a display apparatus includes: loading a display substrate in a chamber and depositing a process gas on the display substrate; taking the display substrate, on which the process gas is deposited, out of the chamber; and cleaning the chamber by injecting plasmarized cleaning gas toward an inside of the chamber through a head unit, in which the cleaning gas is supplied to a storage space of the head unit along at least two paths.

A part of the cleaning gas may be supplied to a center portion of the head unit, and another part of the cleaning gas may be supplied to a portion of the head unit that is deviated from the center portion of the head unit.

The cleaning gas may be obliquely supplied to the storage space of the head unit.

The method of manufacturing a display apparatus may further include plasmarizing the cleaning gas supplied from outside of the chamber.

The method of manufacturing a display apparatus may further include coating the head unit and the chamber by supplying the process gas to the head unit.

The method of manufacturing a display apparatus may further include detecting reaction of the cleaning gas in the chamber.

According to one or more embodiments, a method of manufacturing a display apparatus includes: supplying a cleaning gas to a head unit by plasmarizing the cleaning gas;

supplying the cleaning gas to a storage space of the head unit along at least two paths; and supplying the cleaning gas to an inside of a chamber through the head unit.

The cleaning gas may be supplied to the head unit by being plasmarized outside the head unit.

A part of the cleaning gas may be supplied to a center portion of the head unit, and another part of the cleaning gas may be supplied to a portion of the head unit that is deviated from the center portion of the head unit.

The cleaning gas may be obliquely supplied to the storage space of the head unit.

The method of manufacturing a display apparatus may further include applying a voltage to an electrode unit.

The method of manufacturing a display apparatus may further include detecting a wavelength of the cleaning gas that reacts in the chamber.

The method of manufacturing a display apparatus may further include stopping supply of the cleaning gas according to the wavelength of the cleaning gas.

The method of manufacturing a display apparatus may further include coating the head unit and the chamber by supplying a process gas to the head unit.

The method of manufacturing a display apparatus may further include sucking a gas in the chamber to an outside.

According to one or more embodiments, an apparatus for manufacturing a display apparatus includes: a chamber; a head unit configured to supply a process gas and a cleaning gas to an inside of the chamber, which has a storage space where the process gas or the cleaning gas is temporarily stored, and including a nozzle connected to the storage space and configured to guide the process gas or the cleaning gas from the storage space to the inside of the chamber; a susceptor unit arranged to face the head unit and on which a substrate is placeable; a cleaning gas supply unit connected to the head unit and configured to plasmarize the cleaning gas and supply the cleaning gas that is plasmarized to the head unit; a first cleaning gas ejection unit connected to the cleaning gas supply unit and configured to supply the cleaning gas to a center portion of the storage space; and a second cleaning gas supply unit connected to the cleaning gas supply unit and configured to supply the cleaning gas to a portion of the storage space that is different from the portion to which the first cleaning gas ejection unit supplies the cleaning gas.

These general and specific embodiments may be implemented by using a system, a method, a computer program, or a combination thereof.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
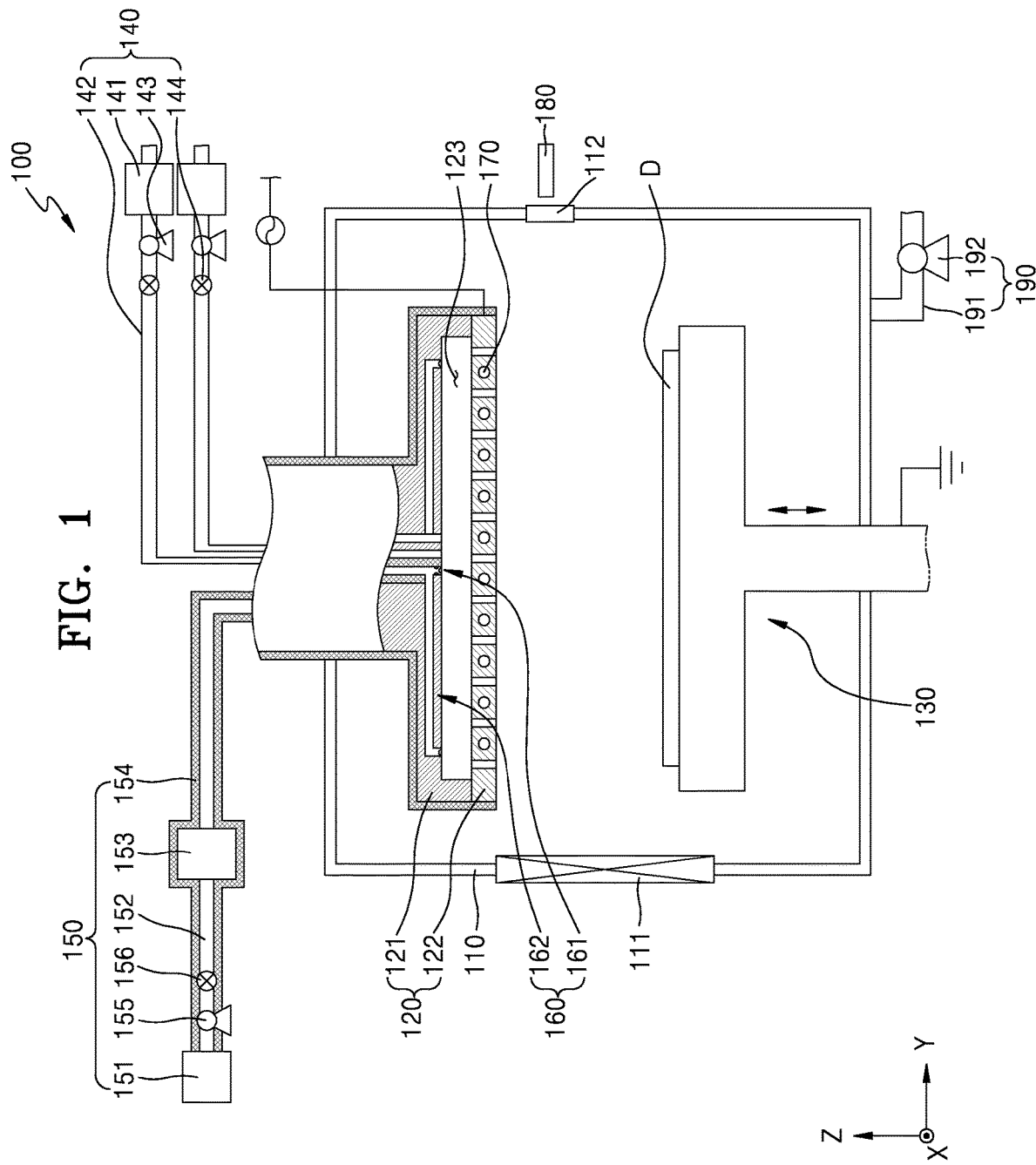
FIG. 1 is a cross-sectional view of an apparatus for manufacturing a display apparatus according to an embodiment.

The attached drawings for illustrating some embodiments of the present disclosure are referred to in order to gain a sufficient understanding of the present disclosure, the merits thereof, and aspects accomplished by the implementation of the present disclosure.

Herein, the present disclosure will be described in further detail by explaining some embodiments of the disclosure with reference to the attached drawings. Like reference numerals in the drawings denote like elements, and redundant explanations may be omitted.

It is to be understood that although the terms "first," "second," etc. may be used herein to describe various components, these components should not be limited by these terms. These components are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
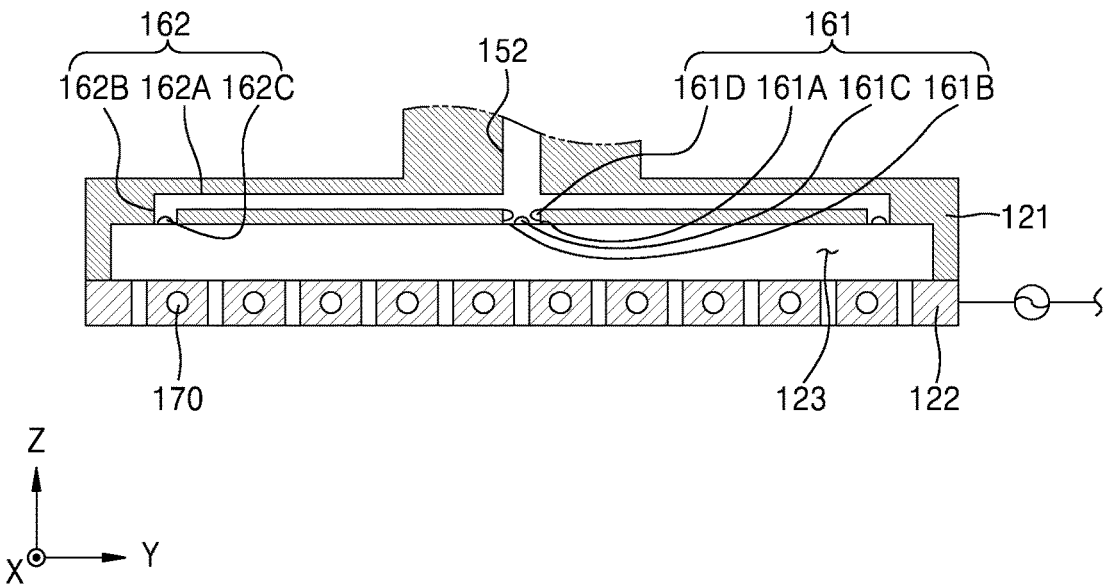
FIG. 2 is a cross-sectional view of a head unit, a cleaning gas supply unit, and a cleaning gas ejection unit illustrated in FIG. 1.
Figure 3:
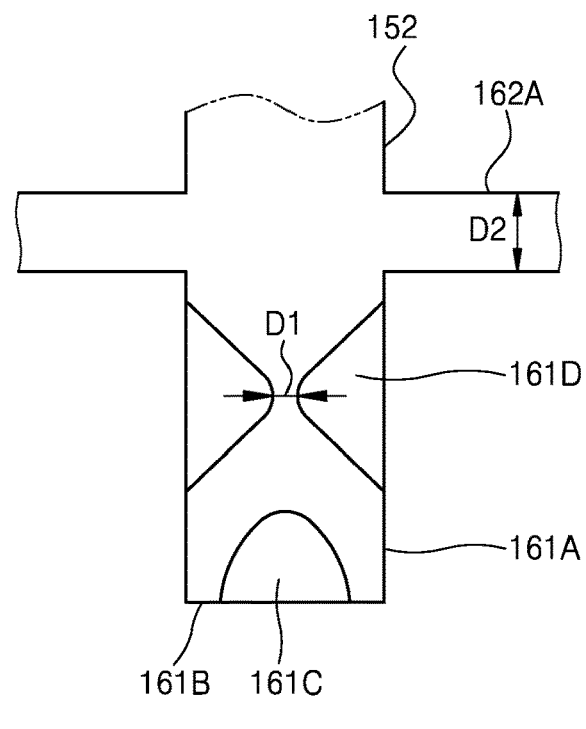
FIG. 3 is a cross-sectional view of an orifice unit illustrated in FIG. 2.
Figure 4:
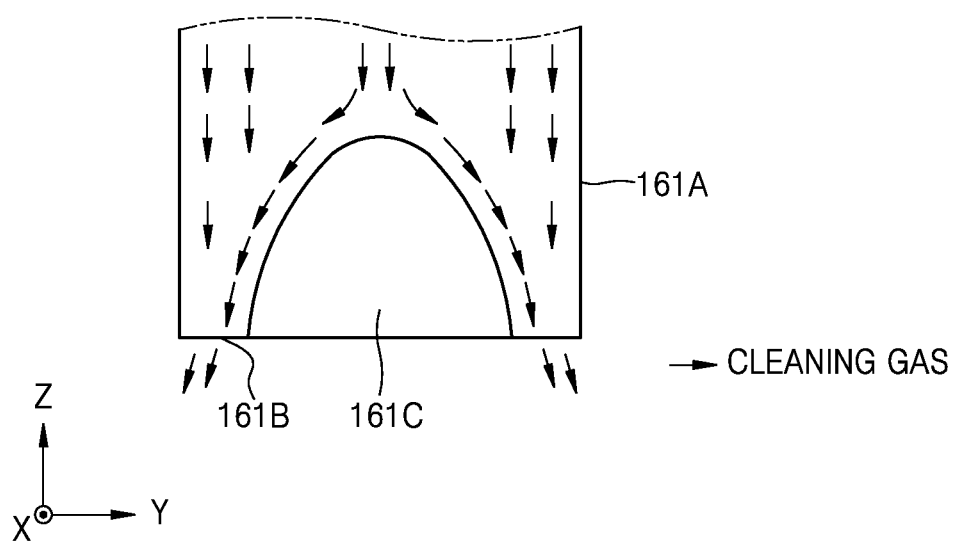
FIG. 4 is a cross-sectional view of a first ejection hole illustrated in FIG. 2.

FIG. 1 is a cross-sectional view of an apparatus 100 for manufacturing a display apparatus according to an embodiment; FIG. 2 is a cross-sectional view of a head unit 120, a cleaning gas supply unit 150, and a cleaning gas ejection unit 160 illustrated in FIG. 1; FIG. 3 is a cross-sectional view of an orifice unit 161D illustrated in FIG. 2; and FIG. 4 is a cross-sectional view of a first ejection hole 161B illustrated in FIG. 2.

Referring to FIGS. 1 to 4, the apparatus 100 for manufacturing a display apparatus according to the present embodiment may include a chamber 110, the head unit 120, a susceptor unit 130, a process gas supply unit 140, the cleaning gas supply unit 150, the cleaning gas ejection unit 160, an electrode unit 170, a sensor unit 180, and a pressure control unit 190.

The chamber 110 may have an internal space with an open portion, through which a display substrate D may be transferred into or out of the chamber 110. A gate valve 111 is arranged in an opening portion of the chamber 110 to open/close the opening portion of the chamber 110.

The head unit 120 is arranged in the chamber 110 to supply a process gas and a cleaning gas to the inside of the chamber 110. The head unit 120 may be provided with a storage space 123 for storing the process gas or the cleaning gas. The head unit 120 may include a head body unit 121 connected to both the process gas supply unit 140 and the cleaning gas supply unit 150. Further, the head unit 120 may include a nozzle unit 122 that is coupled to the cleaning gas supply unit 150, connects the storage space 123 and the inside of the chamber 110, and ejects the process gas or the cleaning gas.

The susceptor unit 130 may be arranged to face the head unit 120. The display substrate D may be placed on the susceptor unit 130 that is capable of moving up and down in the chamber 110. In an embodiment, the susceptor unit 130 may adjust the temperature of the display substrate D or apply a certain voltage to the display substrate D. In some embodiments, the susceptor unit 130 may be connected to an external ground. In the following description, for convenience of explanation, a case in which the susceptor unit 130 is connected to the external ground is mainly described.

The process gas supply unit 140 may be arranged outside the chamber 110 and may be connected to the head unit 120. The process gas supply unit 140 may supply the process gas to the storage space 123 of the head unit 120. In this case, the process gas may be supplied to the head unit 120 to form an amorphous silicon (a-Si) film, a silicon nitride ($SiN_x$) film, a silicon oxide ($SiO_x$) film. For example, the process gas may include any of a silane ($SiH_4$) gas, a hydrogen ($H_2$) gas, an ammonia ($NH_3$) gas, and a gas including a dopant element. Further, the process gas may include a carrier gas such as an argon (Ar) gas, a helium (He) gas, or a nitrogen ($N_2$) gas. The selection of a process gas may influence the type of a film to be formed by the process gas. In the following description, for convenience of explanation, a case in which the process gas includes silane and a nitrogen gas is mainly described.

In an embodiment, the process gas supply unit 140 may include a plurality of process gas supply units. In this case, as each process gas is individually accommodated and the process gas supply units 140 are connected to the head unit 120, each process gas may be independently supplied to the head unit 120.

The process gas supply unit 140 may include a process gas storing unit 141 for storing the process gas, and a process gas guide path 142 connecting the process gas storing unit 141 and the head unit 120 and guiding the process gas to flow from the process gas storing unit 141 to the storage space 123 of the head unit 120. In an embodiment, the process gas supply unit 140 may include a process gas pump 143 arranged on the process gas guide path 142 to allow the process gas to flow, and a process gas shutoff valve 144 for stopping or restarting a flow of the process gas through the process gas guide path 142.

The cleaning gas supply unit 150 may be connected to the head unit 120, aside from the process gas supply unit 140. The cleaning gas supply unit 150 may supply the cleaning gas to the head unit 120. In an embodiment, the cleaning gas supply unit 150 may supply the cleaning gas to the head unit 120 by plasmarizing the same. In an embodiment, the cleaning gas may include nitrogen trifluoride ($NF_3$).

The cleaning gas supply unit 150 may include a cleaning gas storing unit 151 for storing the cleaning gas. The cleaning gas supply unit 150 may include a cleaning gas supply path 152 connecting the cleaning gas storing unit 151 to the head unit 120, and guiding the cleaning gas to flow from the cleaning gas storing unit 151 to the head unit 120. Further, the cleaning gas supply unit 150 may include a plasma generation unit 153 arranged on the cleaning gas supply path 152 and plasmarizing the cleaning gas. The cleaning gas supply unit 150 may include an insulation unit 154 arranged at at least part of the cleaning gas supply path 152. The cleaning gas supply unit 150 may include a cleaning gas pump 155 arranged on the cleaning gas supply path 152 to allow the cleaning gas to flow, and a cleaning gas shutoff valve 156 for stopping or restarting a flow of the cleaning gas through the cleaning gas supply path 152.

The plasma generation unit 153 may have an internal space in which an electrode (not shown) may be arranged. The plasma generation unit 153 may be arranged outside the chamber 110. When the cleaning gas passes through the plasma generation unit 153, a high voltage is applied to the electrode, and, thus, the cleaning gas may be plasmarized. The cleaning gas supply path 152 may guide the cleaning gas plasmarized by the plasma generation unit 153 to flow toward the head unit 120. In an embodiment, the insulation unit 154 may insulate the plasma generation unit 153 and insulate the cleaning gas supply path 152 and the head unit 120.

The cleaning gas ejection unit 160 may be arranged in the head unit 120. In particular, the cleaning gas ejection unit 160 may be inserted in the head body unit 121. The cleaning gas ejection unit 160 may supply the cleaning gas supplied from the cleaning gas supply unit 150 to at least two different portions of the head body unit 121. For example, the cleaning gas ejection unit 160 may supply the cleaning gas to a center portion of the head body unit 121 and a portion that is not the center portion of the head body unit 121.

The cleaning gas ejection unit 160 configured as above may include a first cleaning gas ejection unit 161 connected to the cleaning gas supply unit 150 and supplying the cleaning gas to the center portion of the head body unit 121. Further, the cleaning gas ejection unit 160 may include a second cleaning gas ejection unit 162 connected to the cleaning gas supply unit 150 and supplying the cleaning gas to a portion of the head body unit 121 that is not the center portion of the head body unit 121. In an embodiment, the second cleaning gas ejection unit 162 may include a plurality of second cleaning gas ejection units. At least two of the second cleaning gas ejection units 162 may be symmetrically arranged with respect to the first cleaning gas ejection unit 161. Further, the second cleaning gas ejection units 162 may be arranged by a certain angle around the first cleaning gas ejection unit 161. In an embodiment, each of the second cleaning gas ejection units 162 may be arranged at a same distance from the first cleaning gas ejection unit 161. The second cleaning gas ejection unit 162 may be arranged spaced apart from the first cleaning gas ejection unit 161 in one of an X direction and a Y direction of FIG. 1.

The first cleaning gas ejection unit 161 may include a first cleaning gas guide path 161A connected to the cleaning gas supply path 152. The first cleaning gas ejection unit 161 may include the first ejection hole 161B connected to the first cleaning gas guide path 161A and ejecting the cleaning gas into the storage space 123 of the head unit 120. Further, the first cleaning gas ejection unit 161 may include a first diffuser plate 161C arranged in the first ejection hole 161B.

The first cleaning gas ejection unit 161 may include the orifice unit 161D arranged in the first cleaning gas guide path 161A and adjusting a flow rate of the cleaning gas.

The first diffuser plate 161C may be arranged in the first ejection hole 161B to diffuse the cleaning gas ejected through the first ejection hole 161B. The first diffuser plate 161C may guide the cleaning gas to flow toward an edge portion of the first ejection hole 161B. In an embodiment, the first diffuser plate 161C may have a center portion formed to be higher than the other portion. In an embodiment, the first diffuser plate 161C may be formed inclined from the center portion toward both ends. In this case, the cleaning gas ejected through the first ejection hole 161B may obliquely flow from the center of the first ejection hole 161B toward the edge portion of the first ejection hole 161B in a direction inclined toward the storage space 123.

The first diffuser plate may have any of a variety of shapes, for example, a hemispherical shape, a part of an ellipsoidal shape, or a triangular pyramid shape. In the following description, a case in which the first diffuser plate has a part of an ellipsoidal shape is mainly discussed for convenience of explanation.

The orifice unit 161D may reduce the flow rate of the cleaning gas passing through the first cleaning gas guide path 161A. The orifice unit 161D may have an internal diameter D1, or an area or a diameter in which the cleaning gas passes, of the orifice unit 161D, which increases or decreases with respect to a flow direction of the cleaning gas. In this case, the internal diameter D1 of a center portion of the orifice unit 161D may be the smallest compared to other portions.

The second cleaning gas ejection unit 162 may include a second cleaning gas guide path 162A connected to the cleaning gas supply path 152. The second cleaning gas ejection unit 162 may include a second ejection hole 162B connected to the second cleaning gas guide path 162A. Furthermore, the second cleaning gas ejection unit 162 may include a second diffuser plate 162C arranged in the second ejection hole 162B.

The second cleaning gas guide path 162A may be formed by inserting a pipe into the head body unit 121 or by forming a space in the head body unit 121. In an embodiment, the second cleaning gas guide path 162A may have a circular column shape. In an embodiment, a diameter D2 of the second cleaning gas guide path 162A may be greater than the diameter D1 of the portion having the smallest diameter of the orifice unit 161D.

The second ejection hole 162B may be connected to the second cleaning gas guide path 162A, and, thus, the cleaning gas may be ejected toward the storage space 123. The second ejection hole 162b may change a progression direction of the cleaning gas supplied from the second cleaning gas guide path 162A. For example, the second cleaning gas guide path 162A may guide the cleaning gas in a first direction. In contrast, the second ejection hole 162B may guide the cleaning gas in a second direction that is different from the first direction. In an embodiment, as an inner wall of the second ejection hole 162B facing a portion of the second cleaning gas guide path 162A through which the cleaning gas is ejected is a curved surface, lowering of a movement speed of the cleaning gas may be reduced. An internal area of the second ejection hole 162b may be formed to increase along the movement direction of the cleaning gas.

In an embodiment, the second diffuser plate 162C may be formed to be the same or similar to the first diffuser plate 161C. The second diffuser plate 162C may have any of various shapes. For example, a cross-sectional area of the second diffuser plate 162C may have a triangular shape, a bell shape, or an umbrella shape. The second diffuser plate 162C may be formed to have a higher center portion and a lower edge portion that is gradually lowered from the center portion. In this case, the second diffuser plate 162C may distribute the cleaning gas in a direction from the center portion of the second ejection hole 162b toward an edge portion of the second ejection hole 162B. In an embodiment, the second diffuser plate 162C may have a conical shape.

The electrode unit 170 may be arranged in the head unit 120. For example, the electrode unit 170 may include a plurality of electrode units 170 in the nozzle unit 122. In some embodiments, the electrode unit 170 may be inserted in at least one of the nozzle unit 122 and the head body unit 121. In the following description, for convenience of explanation, a case in which the electrode units 170 are arranged in the nozzle unit 122 by being inserted therein is mainly described.

The sensor unit 180 may be arranged outside the chamber 110 to detect a wavelength (or spectrum) of light generated from the inside of the chamber 110. In an embodiment, the chamber 110 may be provided with a transmission window 112 formed of a transparent material to allow the sensor unit 180 to detect a situation of the inside of the chamber 110.

The pressure control unit 190 may be connected to the chamber 110 and may adjust the pressure in the chamber 110 by exhausting the gas in the chamber 110 to the outside or supplying gas into the chamber 110. The pressure control unit 190 may include a guide pipe 191 connected to the chamber 110 and a pressure control pump 192 arranged along the guide pipe 191.

In the operation of the apparatus 100 for manufacturing a display apparatus, after the pressure control unit 190 forms the pressure in the chamber 110 to be the same or similar to a certain pressure, for example, atmospheric pressure or a pressure that is the same as the pressure in another chamber, the gate valve 111 may be operated to open the opening portion of the chamber 110. The display substrate D may be inserted into the chamber 110 from the outside and placed on the susceptor unit 130. The display substrate D may enter the chamber 110 from the outside by means of a robot arm or a shuttle, for example.

When the display substrate D is pressed or placed onto the susceptor unit 130, the process gas supply unit 140 may supply the process gas to the head unit 120. As a voltage is applied to the electrode unit 170 to plasmarize the process gas, part of the process gas may be deposited on the display substrate D. In this case, the apparatus 100 for manufacturing a display apparatus may form one of various layers (or films) of the display substrate D. For example, the apparatus 100 for manufacturing a display apparatus may form an amorphous silicon film on the display substrate D. In some embodiments, the apparatus 100 for manufacturing a display apparatus may form an inorganic film of a thin film encapsulation layer on the display substrate D. In the following description, for convenience of explanation, a case in which the apparatus 100 for manufacturing a display apparatus forms an inorganic film of the thin film encapsulation layer on the display substrate D is mainly described.

During a process of depositing part of a deposition gas on the display substrate D as above, the pressure control unit 190 may exhaust the gas in the chamber 110 to the outside.

When the above process is completed, the pressure control unit 190 may maintain the pressure in the chamber 110 in a certain pressure state and the gate valve 111 may operate to open the opening portion of the chamber 110. Further, the robot arm or shuttle outside the chamber 110 may enter the chamber 110 to draw the display substrate D that passed the deposition process, to the outside of the chamber 110.

The above tasks may be repeated multiple times. The apparatus 100 for manufacturing a display apparatus may clean the inside of the chamber 110 when a certain value (e.g., a preset value) is reached while performing the above tasks multiple times.

In further detail, when part of the process gas is deposited on the display substrate D by supplying part of the process gas thereto, part of the process gas may be adsorbed on the chamber 110, the susceptor unit 130, and the head unit 120, in addition to the display substrate D. In this case, a concentration of the deposition gas may not be constant when the display substrate D is newly deposited later, and, further, deposition quality and deposition efficiency may deteriorate due to falling of foreign materials or mixing of foreign materials. To prevent or substantially prevent the above events, the deposition process is performed for a certain number of times as above, and the inside of the chamber 110 may be cleaned with the cleaning gas.

When cleaning begins as above, the pressure control unit 190 may maintain the pressure in the chamber 110 in a substantially vacuum state by sucking the gas in the chamber 110 to be exhausted to the outside.

Then, the cleaning gas may be plasmarized by the cleaning gas supply unit 150 and supplied to the cleaning gas ejection unit 160. The cleaning gas ejection unit 160 may inject the cleaning gas toward at least two portions of the storage space 123. In particular, the cleaning gas supplied to the cleaning gas supply unit 150 may be supplied by being divided through the first cleaning gas ejection unit 161 and the second cleaning gas ejection unit 162.

When the cleaning gas is supplied as described above, the first cleaning gas ejection unit 161 may control the flow rate of the cleaning gas. For example, since the orifice unit 161D reduces the flow rate of the cleaning gas compared to the flow rate of the cleaning gas passing through the first cleaning gas guide path 161A, the flow rate of the cleaning gas supplied by passing through the first ejection hole 161B may be reduced.

The second cleaning gas ejection unit 162 may quickly move the cleaning gas toward a side of the second ejection hole 162B via the second cleaning gas guide path 162A.

In general, when the cleaning gas is supplied to the storage space through a single path, the cleaning gas is moved in the storage space through diffusion, and, thus, the concentration of the cleaning gas in the storage space may not be uniform. In this case, the concentration of the cleaning gas entering the chamber 110 via the nozzle unit 122 may be different at a center portion of the chamber 110 and an inner wall of the chamber 110. In particular, when the concentration of the cleaning gas is low, part of the process gas adsorbed on the inner wall of the chamber 110 does not react with the cleaning gas, and, thus, the inner wall of the chamber 110 may not be cleaned. Further, the susceptor part or the head unit part adjacent to the inner wall of the chamber 110 may not be cleaned. In this case, a problem of falling of foreign materials during deposition of a next display substrate as described above may occur.

However, the above problem may be avoided due to the first cleaning gas ejection unit 161 and the second cleaning gas ejection unit 162. In further detail, the orifice unit 161D may partially reduce the flow rate of the cleaning gas ejected through the first ejection hole 161B and may increase the ejection speed of the cleaning gas, compared to a case in which the orifice unit 161D is omitted. In this case, even when the cleaning gas is ejected into the storage space 123 from the second ejection hole 162B later than from the first ejection hole 161B, the cleaning gas may be quickly diffused from a center portion of the storage space 123 to an edge portion of the storage space 123. Furthermore, since the movement of the cleaning gas in the storage space 123 is promoted, the concentration of the cleaning gas may become uniform in the storage space 123.

Further, since the second cleaning gas guide path 162A allows the cleaning gas to move to a portion that is not the center portion of the head unit 120, the cleaning gas may be quickly moved to various portions of the storage space 123 compared to a method of diffusing the cleaning gas in the storage space 123 through a single path.

In addition, the first diffuser plate 161C and the second diffuser plate 162C enable the cleaning gas to be obliquely incident on an upper surface of the storage space 123. In this case, the cleaning gas may be ejected in various directions in the storage space 123, and may be moved in various directions from the center portion of the storage space 123 to the edge portion of the storage space 123.

When the cleaning gas is ejected into the storage space 123 as described above, the cleaning gas may have a same or similar concentration in the entire area of the storage space 123.

When the cleaning gas is continuously supplied to the storage space 123 as described above, the cleaning gas may be ejected through the nozzle unit 122. In this state, the F radical of the cleaning gas reacts with the part of the deposition gas adsorbed in the inner wall of the chamber 110, the susceptor unit 130, the head unit 120, etc., thereby removing the part of the deposition gas.

While the chamber 110, the susceptor unit 130, and the head unit 120 are cleaned by using the cleaning gas as described above, a voltage may be applied to the electrode unit 170. In this case, since the electrode unit 170 promotes the reaction between the cleaning gas and the part of the process gas deposited on the chamber 110, the susceptor unit 130, the head unit 120, etc., the part of the process gas may be quickly removed.

During the above process, the pressure control unit 190 may suck the gas in the chamber 110 and exhaust the gas to the outside.

When the above process is performed, the cleaning gas reacts with the part of the deposition gas adsorbed on the inner wall of the chamber 110, the susceptor unit 130, the head unit 120, etc. to generate light or energy. The sensor unit 180 may detect light generated in the chamber 110 through the transmission window 112. In particular, the sensor unit 180 may detect the existence, intensity, wavelength, and spectrum of light generated in the chamber 110. In the following description, for convenience of explanation, a case in which the sensor unit 180 detects the existence of light is mainly described.

When the sensor unit 180 detects light, the apparatus 100 for manufacturing a display apparatus may continuously perform the cleaning process as described above. When no light is detected by the sensor unit 180, the intensity of light is equal to or less than a certain level, no wavelength of light is detected, or a particular wavelength of the spectrum of light is not detected, the apparatus 100 for manufacturing a display apparatus may stop the above-described cleaning process.

When the cleaning process is stopped, the process gas supply unit 140 supplies part of the process gas to the head unit 120 and applies a voltage to the electrode unit 170 to allow part of the process gas to be deposited on the chamber 110, the susceptor unit 130, the head unit 120, etc., and thus surfaces of the chamber 110, the susceptor unit 130, the head unit 120, etc. may be protected by being coated with the part of the process gas. When the electrode unit 170 is exposed to the outside, the above process may be performed on the electrode unit 170 in the same manner.

Accordingly, in the apparatus 100 for manufacturing a display apparatus and a method of manufacturing a display apparatus, since the cleaning gas is uniformly supplied to the inside of the chamber 110, cleaning performance may be improved. Further, in the apparatus 100 for manufacturing a display apparatus and a method of manufacturing a display apparatus, since the cleaning gas has a uniform concentration not only in the center portion of the chamber 110, but also in a portion adjacent to the inner wall of the chamber 110, a cleaning time may be reduced. In the apparatus 100 for manufacturing a display apparatus and a method of manufacturing a display apparatus, since the concentration of the cleaning gas becomes uniform within a short time, an amount of use of the cleaning gas may be reduced. Further, in the apparatus 100 for manufacturing a display apparatus and a method of manufacturing a display apparatus, since the foreign materials adsorbed on the chamber 110, the susceptor unit 130, the head unit 120, etc. are effectively removed, defects due to the foreign materials during manufacture of a display apparatus may be substantially reduced.

Figure 5:
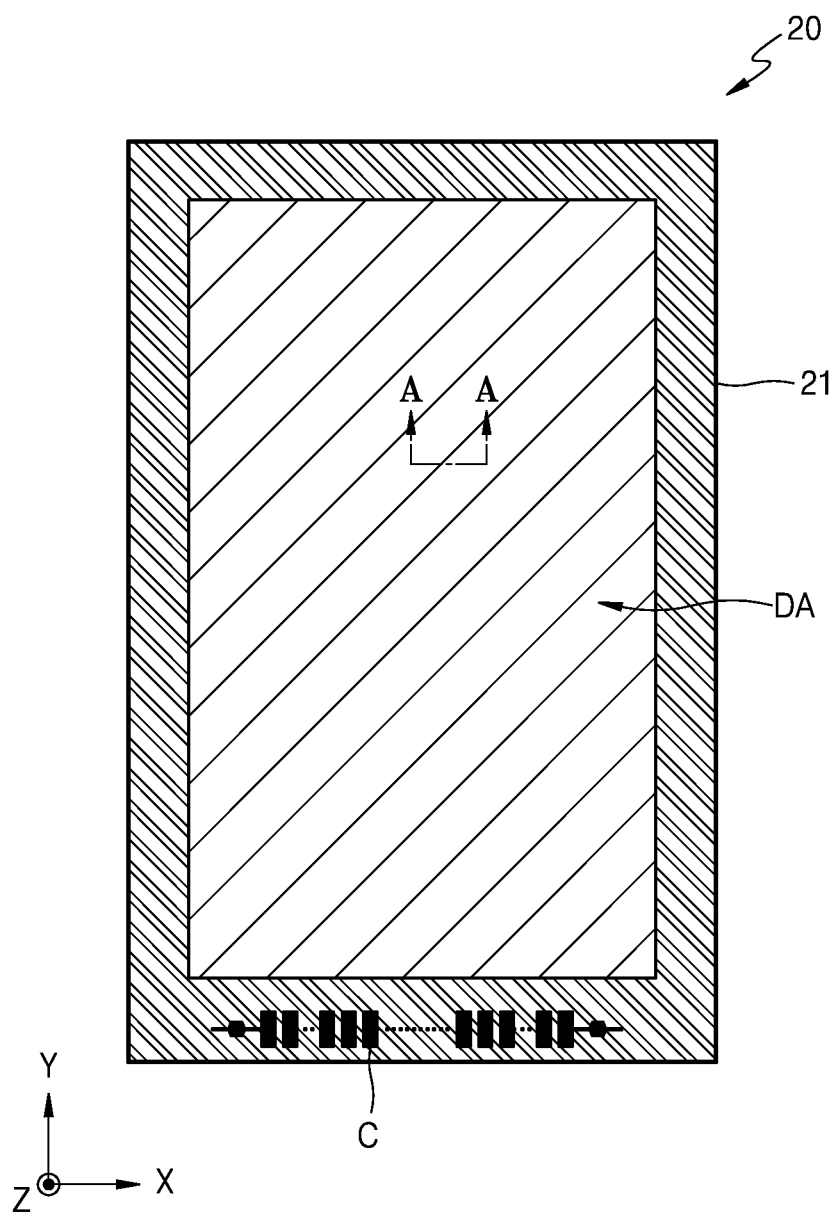
FIG. 5 is a plan view of a display apparatus manufactured by the apparatus for manufacturing a display apparatus illustrated in FIG. 1, according to an embodiment.
Figure 6:
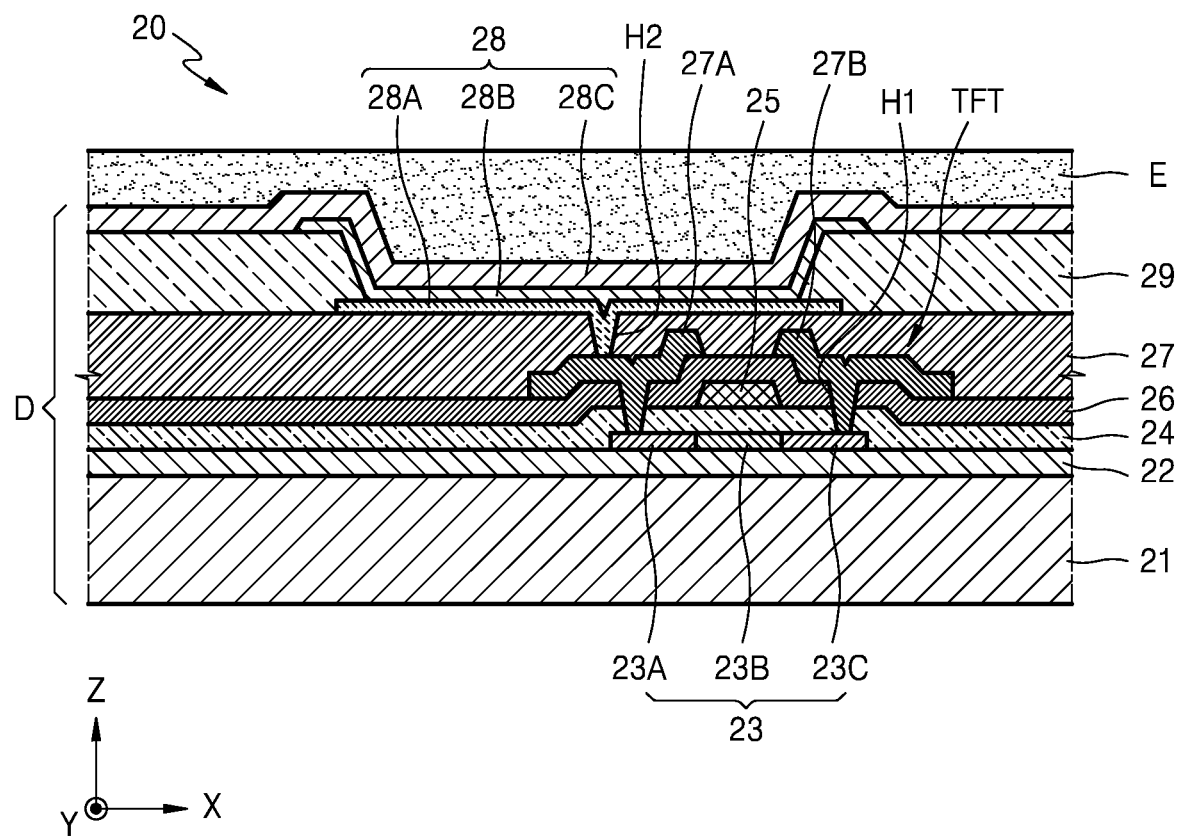
FIG. 6 is a cross-sectional view taken along the line A-A of FIG. 5.

FIG. 5 is a plan view of a display apparatus manufactured by the apparatus 100 for manufacturing a display apparatus illustrated in FIG. 1, according to an embodiment; and FIG. 6 is a cross-sectional view taken along the line A-A of FIG. 5.

Referring to FIGS. 5 and 6, a display area DA and a non-display area outside the display area DA may be defined in a display apparatus 20 on a substrate 21. A light-emitting unit (not referenced) may be arranged in the display area DA, and a power line (not shown) may be arranged in the non-display area. Further, a pad portion C may be arranged in the non-display area.

The display apparatus 20 may include the display substrate D and a thin film encapsulation layer E. The display substrate D may include the substrate 21 and an organic light-emitting device (OLED) 28.

The substrate 21 may include a plastic material or a metal material, such as SUS or Ti. In an embodiment, the substrate 21 may include polyimide (PI). In the following description, for convenience of explanation, a case in which the substrate 21 includes polyimide is mainly described.

An emission unit (not referenced) may be arranged on the substrate 21. The emission unit may include a thin film transistor TFT, and a passivation film 27 to cover the thin film transistor TFT, and the OLED 28 may be formed on the passivation film 27.

A buffer layer 22 formed of an organic compound and/or an inorganic compound, for example, $SiO_x$ ($x \geq 1$), $SiN_x$ ($x \geq 1$), may be further formed on an upper surface of the substrate 21.

After an active layer 23 in a certain pattern is arranged on the buffer layer 22, the active layer 23 is buried by a gate insulating layer 24. The active layer 23 has a source region 23C and a drain region 23A, and further includes a channel region 23B therebetween.

The source region 23C and the drain region 23A of the active layer 23 are doped with impurities according to the type of a thin film transistor, for example, a driving thin film transistor (not shown) or a switching thin film transistor (not shown).

An interlayer insulating layer 26 burying a gate electrode 25 is formed on an upper surface of the gate insulating layer 24.

After forming a contact hole H1 in the interlayer insulating layer 26 and the gate insulating layer 24, a source electrode 27B and a drain electrode 27A are formed on the interlayer insulating layer 26 to contact the source region 23C and the drain region 23A, respectively.

The passivation film 27 is formed on the thin film transistor formed as above, and a pixel electrode 28A of the OLED 28 is formed on the passivation film 27. The pixel electrode 28A contacts the drain electrode 27A of the thin film transistor TFT through a via hole H2 formed in the passivation film 27. The passivation film 27 may be formed of an inorganic material and/or an organic material in a single layer or in two or more layers. The passivation film 27 may be formed as a planarization film to planarize an upper surface regardless of waviness of an underlying layer, or may be formed to be wavy along the waviness of an underlying layer. The passivation film 27 may be formed of a transparent insulator to achieve a resonance effect.

After the pixel electrode 28A is formed on the passivation film 27, to cover the pixel electrode 28A and the passivation film 27, a pixel defining film 29 is formed of an organic material and/or an inorganic material, and is opened to expose the pixel electrode 28A.

An intermediate layer 28B and a counter electrode 28C are formed at least on the pixel electrode 28A.

While, in an embodiment, the pixel electrode 28A functions as an anode electrode and the counter electrode 28C functions as a cathode electrode, the polarities of the pixel electrode 28A and the counter electrode 28C may be switched.

The pixel electrode 28A and the counter electrode 28C are insulated from each other by the intermediate layer 28B. An organic emission layer emits light by applying voltage having different polarities to the intermediate layer 28B.

The intermediate layer 28B may include an organic emission layer. In some embodiments, the intermediate layer 28B may include an organic emission layer, and may further include at least one of a hole injection layer (HIL), a hole transport layer (HTL), an electron transport layer (ETL), and an electron injection layer (EIL). However, the present disclosure is not limited thereto, and the intermediate layer 28B may include an organic emission layer and may further include any of various other functional layers (not shown).

One unit pixel includes a plurality of subpixels, which emit light rays of various colors. For example, the unit pixel may include subpixels emitting a red light ray, a green light ray, and a blue light ray, or may include subpixels emitting a red light ray, a green light ray, a blue light ray, and a white light ray.

As described above, the thin film encapsulation layer E may include a plurality of inorganic layers, or an inorganic layer and an organic layer.

The organic layer of the thin film encapsulation layer E may be formed of a polymer, and, in an embodiment, may be formed of a single layer or a stacked layer formed of any of polyethylene terephthalate, polyimide, polycarbonate, epoxy, polyethylene, and polyacrylate. The organic layer may be formed of polyacrylate, and in an embodiment, may include a polymerized monomer composition including a diacrylate-based monomer and a triacrylate-based monomer. The monomer composition may further include a monoacrylate-based monomer. In an embodiment, the monomer composition may further include a well-known photoinitiator, such as TPO, but the present disclosure is not limited thereto.

The inorganic layer of the thin film encapsulation layer E may be a single layer or a stacked layer including a metal oxide or a metal nitride. In further detail, the inorganic layer may include any of SiNx, $Al_2O_3$, $SiO_2$, and $TiO_2$.

A top layer of the thin film encapsulation layer E exposed to the outside may include an inorganic layer to prevent or substantially prevent intrusion of moisture into the organic emission device.

In an embodiment, the thin film encapsulation layer E may include at least one sandwich structure in which at least one organic layer is inserted between at least two inorganic layers. In another example, the thin film encapsulation layer E may include at least one sandwich structure in which at least one inorganic layer is inserted between at least two organic layers. In another example, the thin film encapsulation layer E may include a sandwich structure in which at least one organic layer is inserted between at least two inorganic layers and a sandwich structure in which at least one inorganic layer is inserted between at least two organic layers.

In an embodiment, the thin film encapsulation layer E may include a first inorganic layer, a first organic layer, and a second inorganic layer sequentially above the OLED.

In another example, the thin film encapsulation layer E may include a first inorganic layer, a first organic layer, a second inorganic layer, a second organic layer, and a third inorganic layer sequentially above the OLED.

In another example, the thin film encapsulation layer E may include a first inorganic layer, a first organic layer, a second inorganic layer, a second organic layer, a third inorganic layer, a third organic layer, and a fourth inorganic layer sequentially above the OLED.

In an embodiment, a metal halide layer including LiF may be further included between the OLED and the first inorganic layer. The metal halide layer may prevent or substantially prevent the OLED from being damaged when the first inorganic layer is formed in a sputtering method.

The first organic layer may be formed to have an area smaller than the second inorganic layer, and the second organic layer may have an area smaller than the third inorganic layer.

As described above, the inorganic layer may be manufactured by using the above-described apparatus for manufacturing a display apparatus. In this case, after inserting the display substrate D in a chamber (not shown), the inorganic layer may be deposited on the display substrate D by using process gas. Since the part of the process gas is deposited on the display substrate D when foreign materials in the apparatus for manufacturing a display apparatus are effectively removed as described above, the display apparatus 20 may implement a clear and accurate image.

As described above, in the apparatus and method of manufacturing a display apparatus according to the present disclosure, foreign materials may be effectively removed from the chamber. Further, in the apparatus and method of manufacturing a display apparatus according to the present disclosure, the concentration of the cleaning gas may be uniformly maintained in the entire area of the chamber.

It is to be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    loading a display substrate in a chamber and depositing a process gas on the display substrate;
    taking the display substrate, on which the process gas is deposited, out of the chamber; and
    cleaning the chamber by injecting plasmarized cleaning gas toward an inside of the chamber through a head unit,
    wherein the plasmarized cleaning gas is supplied to a storage space of the head unit along at least two paths so as to be ejected into the storage space at at least two locations, and
    wherein, along at least one path of the at least two paths, the plasmarized cleaning gas is passed through an orifice unit and subsequently passed over a diffuser plate that is arranged in an ejection hole such that the plasmarized cleaning gas is obliquely ejected into the storage space, the orifice unit has an internal diameter that decreases along a flow direction of the plasmarized cleaning gas to a first diameter, and the first diameter is less than a second diameter of at least another path of the at least two paths.

2. The method of manufacturing a display apparatus of claim 1, wherein a part of the plasmarized cleaning gas is supplied to a center portion of the head unit, and another part of the plasmarized cleaning gas is supplied to a portion of the head unit that is deviated from the center portion of the head unit.

3. The method of manufacturing a display apparatus of claim 1, further comprising plasmarizing the cleaning gas supplied from outside of the chamber.

4. The method of manufacturing a display apparatus of claim 1, further comprising coating the head unit and the chamber by supplying the process gas to the head unit.

5. The method of manufacturing a display apparatus of claim 1, further comprising detecting reaction of the plasmarized cleaning gas in the chamber.

6. A method of manufacturing a display apparatus, the method comprising:
    plasmarizing a cleaning gas;
    supplying the plasmarized cleaning gas to a storage space of a head unit along at least two paths so as to be ejected into the storage space at at least two locations; and
    supplying the plasmarized cleaning gas to an inside of a chamber through the head unit,
    wherein, along at least one path of the at least two paths, the plasmarized cleaning gas is passed through an orifice unit and subsequently passed over a diffuser plate that is arranged in an ejection hole such that the plasmarized cleaning gas is obliquely ejected into the storage space, the orifice unit has an internal diameter that decreases along a flow direction of the plasmarized cleaning gas to a first diameter, and the first diameter is less than a second diameter of at least another path of the at least two paths.

7. The method of manufacturing a display apparatus of claim 6, wherein the plasmarized cleaning gas is supplied to the head unit by being plasmarized outside the head unit.

8. The method of manufacturing a display apparatus of claim 6, wherein a part of the plasmarized cleaning gas is supplied to a center portion of the head unit, and another part of the plasmarized cleaning gas is supplied to a portion of the head unit that is deviated from the center portion of the head unit.

9. The method of manufacturing a display apparatus of claim 6, further comprising applying a voltage to an electrode unit arranged in the head unit.

10. The method of manufacturing a display apparatus of claim 6, further comprising detecting a wavelength of the plasmarized cleaning gas that reacts in the chamber.

11. The method of manufacturing a display apparatus of claim 10, further comprising stopping supply of the plasmarized cleaning gas according to the wavelength of the plasmarized cleaning gas.

12. The method of manufacturing a display apparatus of claim 6, further comprising coating the head unit and the chamber by supplying a process gas to the head unit.

13. The method of manufacturing a display apparatus of claim 6, further comprising sucking a gas in the chamber to an outside.

14. The method of manufacturing a display apparatus of claim 6, wherein the orifice unit has the first diameter at a center portion thereof, and the first diameter is a smallest diameter compared to portions of the orifice unit that are at opposite sides of the center portion.

15. The method of manufacturing a display apparatus of claim 6, wherein the at least another path of the at least two paths has the second diameter at a portion thereof that is adjacent to the at least one path of the at least two paths.

* * * * *